(12) United States Patent
Ito et al.

(10) Patent No.: US 7,196,895 B2
(45) Date of Patent: Mar. 27, 2007

(54) ELECTRONIC CONTROL SYSTEM HAVING POWER SOURCE RELAY FUSION DETECTING CIRCUIT

(75) Inventors: Yoshihiro Ito, Kariya (JP); Toshio Tsutsui, Takahama (JP)

(73) Assignee: Denso Corporation, Kariya (JP)

( * ) Notice: Subject to any disclaimer, the term of this patent is extended or adjusted under 35 U.S.C. 154(b) by 52 days.

(21) Appl. No.: 11/022,841

(22) Filed: Dec. 28, 2004

(65) Prior Publication Data
US 2005/0168904 A1    Aug. 4, 2005

(30) Foreign Application Priority Data
Jan. 29, 2004   (JP)   ............................. 2004-021544
Sep. 28, 2004   (JP)   ............................. 2004-281579

(51) Int. Cl.
H01H 9/00       (2006.01)
H01H 47/00      (2006.01)
H01H 51/22      (2006.01)
H01H 51/30      (2006.01)

(52) U.S. Cl. ...................................... 361/160
(58) Field of Classification Search ................. 361/160
See application file for complete search history.

(56) References Cited

U.S. PATENT DOCUMENTS 5,804,973 A    9/1998  Shinohara et al.
6,577,024 B2 * 6/2003  Kikuta et al. .............. 307/10.1
6,795,762 B2 * 9/2004  Itoh et al. .................... 701/43
2002/0057015 A1 5/2002 Kikuta et al.

FOREIGN PATENT DOCUMENTS

GB    2 333 914       8/1999
JP    A-2004-32903    1/2004

OTHER PUBLICATIONS

Communication pursuant to Article 96(2) dated Nov. 22, 2006 from European Patent Office for counterpart application of 04 030 992.4-2425.

* cited by examiner

Primary Examiner—Stephen W. Jackson
Assistant Examiner—Dharti H. Patel
(74) Attorney, Agent, or Firm—Posz Law Group, PLC (57) ABSTRACT

An electronic control system comprises a power source, a controller and a power source relay for supplying and cutting off a supply of power to the controller. A fusion detecting circuit includes a capacitor and a first resistor connected to the power source relay to detect fusion of the power source relay. A second resistor is connected in parallel to the first resistor. A switching element is connected to one of the first resistor and the second resistor in series. The switching element is set to an ON-state when the power source relay is set to the OFF-state, thereby discharging a charge accumulated in the capacitor through the first resistor and the second resistor.

9 Claims, 6 Drawing Sheets

ELECTRONIC CONTROL SYSTEM HAVING POWER SOURCE RELAY FUSION DETECTING CIRCUIT

CROSS REFERENCE TO RELATED APPLICATION

This application is based on and incorporates herein by reference Japanese Patent Applications No. 2004-21544 filed Jan. 29, 2004 and No. 2004-281579 filed Sep. 28, 2004.

FIELD OF THE INVENTION

The present invention relates to an electronic control system having a fusion detecting circuit for a power source relay.

BACKGROUND OF THE INVENTION

In many electronic control systems, a power source relay is used to control a power supply to an electronic controller, actuators and the like. The power source relay may sometimes be held fixed to any one of the ON-state and the OFF-state contrary to the instruction from an external instruction signal to change the ON/OFF state. For instance, a movable contact is held inseparably fused to a fixed contact, and is uncontrollable to the other state. It is necessary to detect fusion (welding) of the power source relay. One example of such a fusion detecting circuit is disclosed in JP 2004-32903A.

Figure 8:
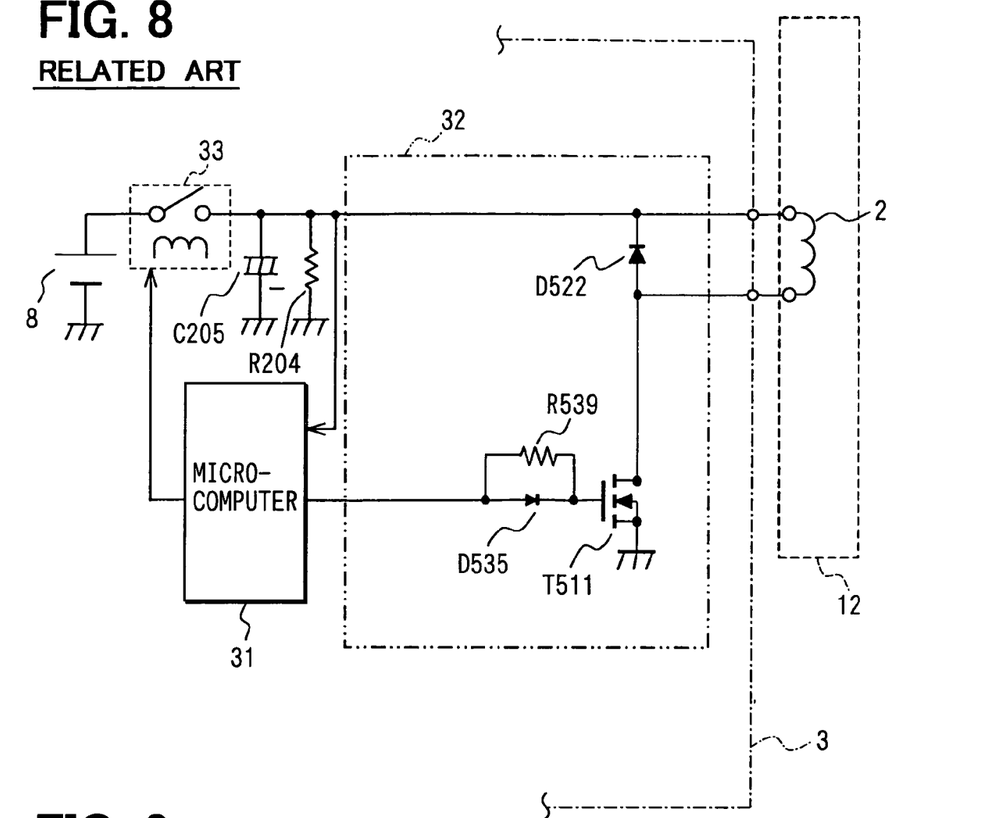
FIG. 8 is a circuit diagram showing a fusion detecting circuit part according to a related art.

One method for detecting a fusion is proposed as shown in FIG. 8. Specifically, the input side of a power source relay 33 is connected to a power source such as a battery 8 or the like, and the output side thereof is connected to a target such as a solenoid driving circuit 32 in an electronic controller 3 for a solenoid 2 in an actuator 12. The actuator 12 may be a transfer-ratio varying mechanism for a vehicle steering system, which is to be supplied with electric power. A capacitor C205 and a resistor R204 are connected to the output side of the power source relay 33 for detecting the fusion of the power source relay 33.

Figure 9:
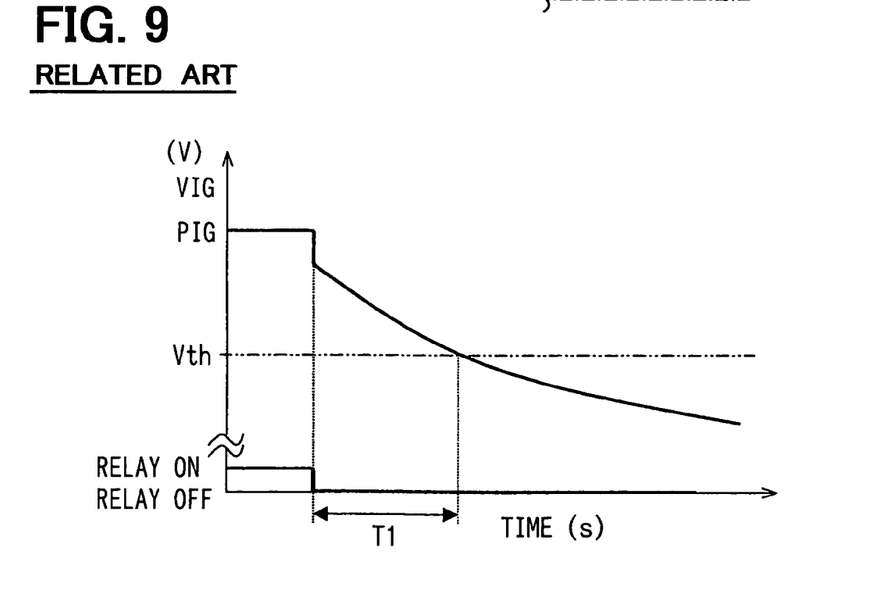
FIG. 9 is a signal diagram showing variation of an output voltage of a power source relay in the related art.

When the power source relay 33 is set to the ON-state to start the operation of the solenoid 2, the voltage of the battery 8 is applied between both ends of the capacitor C205. The charge corresponding to the voltage PIG in FIG. 9 is accumulated.

Under this condition, a duty ratio of a PWM signal is transmitted as a control instruction to the solenoid 2 from the microcomputer 31. The solenoid 2 is connected in parallel with a diode D522. A transistor T511 is subjected to duty operation through a resistor R539 and a diode D535 to drive the solenoid 2. By changing the duty ratio of the PWM signal from the microcomputer 31, the current flowing in the solenoid 2 is varied, and the electromagnetic force generated by the solenoid 2 is also varied.

When the power source relay 33 is set to the OFF-state to stop the operation of the solenoid 2, the capacitor C205 starts to discharge the charge accumulated therein. The charge thus discharged (that is, current) is consumed by the resistor R204. The voltage of the capacitor C205, that is, the output voltage of the power source relay 33, normally decreases with time as shown in FIG. 9.

The power source relay 33 is detected as having been fused, if an output voltage VIG of the relay 33 (i.e., the terminal voltage of the capacitor C205) does not become lower than a threshold voltage value Vth set for the fusion detection within a predetermined detection time T1 after the power source relay 33 is set from the ON-state to the OFF-state in response to an instruction from an external side such as a microcomputer 31. This fusion detection may be attained by the microcomputer 31 or by other circuits.

In the fusion detecting method for the power source relay described above, it is desired that the detection time T1 is short. Furthermore, the voltage VIG can be represented by PIG X exp(-t/RC). Accordingly, it is desired that the value of the resistor R204 for discharging the charge accumulated in the capacitor C205 is small. However, current flows in the resistor R204 during normal operation, that is, when the power source relay 33 is kept set to the ON-state. Thus, if the value of the resistor R204 is small, the current value is increased. The current flowing in the resistor R204 is not used to drive the solenoid 2 and is loss current.

This loss current is consumed by the resistor R204, so that the resistor R204 is heated. When the heating amount of the resistor R204 is increased, the ambient temperature of the surrounding of the resistor R204 and the temperature of the substrate rise up. As a result, electronic circuit parts durable to the rise-up of the temperature must be used. This is, the parts to be used are restricted, resulting in increase of the part cost and the manufacturing cost.

SUMMARY OF THE INEVNTION

The present invention has an object to provide an electronic control system, which can surely detect fusion of a power source relay in low cost and has small loss current. The present invention is particularly advantageous for a vehicle control system such as an electric power steering system, in which a large current of more than tens of amperes flows in the power source relay.

According to one aspect of the present invention, an electronic control system includes a power source, an actuator, a controller, a power source relay, and a fusion detecting circuit. The fusion detecting circuit includes a first resistor and a capacitor connected between the power source relay and the ground to detect fusion of the power source relay based on a voltage of the capacitor. The electronic control system further includes a second resistor connected in parallel to the first resistor between the power source relay and the ground, and a switching element connected to one of the first resistor and the second resistor in series, and a charge removing circuit for setting the switching element to an ON-state when the power source relay is set to the OFF-state, thereby discharging a charge accumulated in the capacitor through the first resistor and the second resistor. The fusion detecting circuit detects the fusion of the power source relay based on the voltage of the capacitor.

With the above construction, the charge accumulated in the capacitor is discharged by the two resistors. Therefore, the value of the current flowing in the first resistor is made smaller, and the heating quantity is also made smaller. Accordingly, the increase of temperature is small and thus resistors having small resistance to heat can be used, so that the part cost and the manufacturing cost can be reduced.

According to another aspect of the present invention, a fusion detecting circuit includes only one resistor in parallel with a capacitor, a switching element connected in series to the resistor, and a charge removing circuit. The charge moving circuit sets the switching element to an ON-state when the power source relay is set to the OFF-state, thereby discharging a charge accumulated in the capacitor through the resistor so that the fusion of the power source relay is detected.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in further detail with reference to various embodiments, which are provided in an electronic control system shown in FIGS. 1 to 7.

First Embodiment

Figure 1:
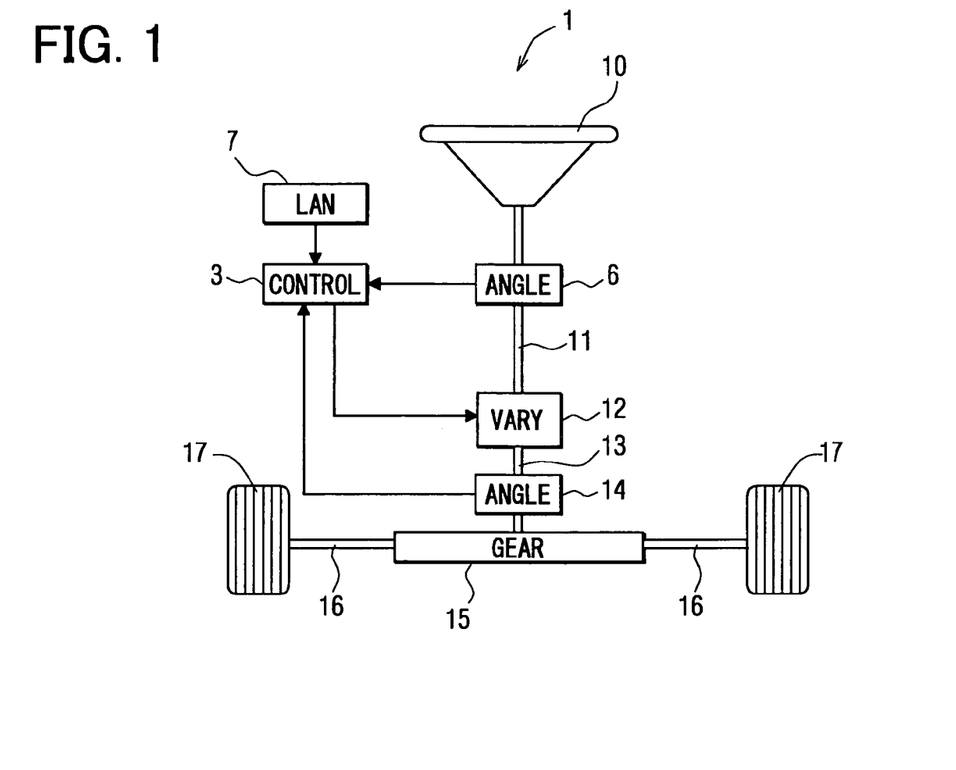
FIG. 1 is a schematic diagram showing a transfer-ratio varying steering device to which embodiments of the present invention is applied.

Referring first to FIG. 1, the electronic control system is a transfer-ratio varying steering system 1. A steering wheel 10 of a vehicle is connected to the upper end of an input shaft 11. The lower end of the input shaft 11 and the upper end of an output shaft 13 are connected to each other through a transfer-ratio varying mechanism 12. Furthermore, the lower end of the output shaft 13 is equipped with a pinion (not shown), and the pinion is engaged with a rack 16 in a steering gear box 15. Furthermore, an electromotive power steering device (not shown) is equipped in the steering gear box 15. Steered tire wheels 17 are connected to both ends of the rack 16 through tie rods and arms (not shown).

The input shaft 11 is equipped with a steering angle sensor 6 for detecting the steering angle of the steering wheel 10. The output shaft 13 is equipped with an output angle sensor 14 including a resolver for detecting the turning angle of the steered wheels 17. The output angle sensor 14 may be equipped in the transfer-ratio varying mechanism unit 12.

The steering angle of the input shaft 11 and the rotational angle of the output shaft 13 which are detected by the steering angle sensor 6 and the output angle sensor 14 are input to a transfer-ratio controller 3. Furthermore, a vehicle speed signal, an engine speed signal, etc. are input from a vehicle-mounted LAN (Local Area Network) 7 to the transfer-ratio controller 3. The transfer-ratio controller 3 outputs a control signal for controlling the transfer-ratio varying mechanism unit 12.

Figure 2:
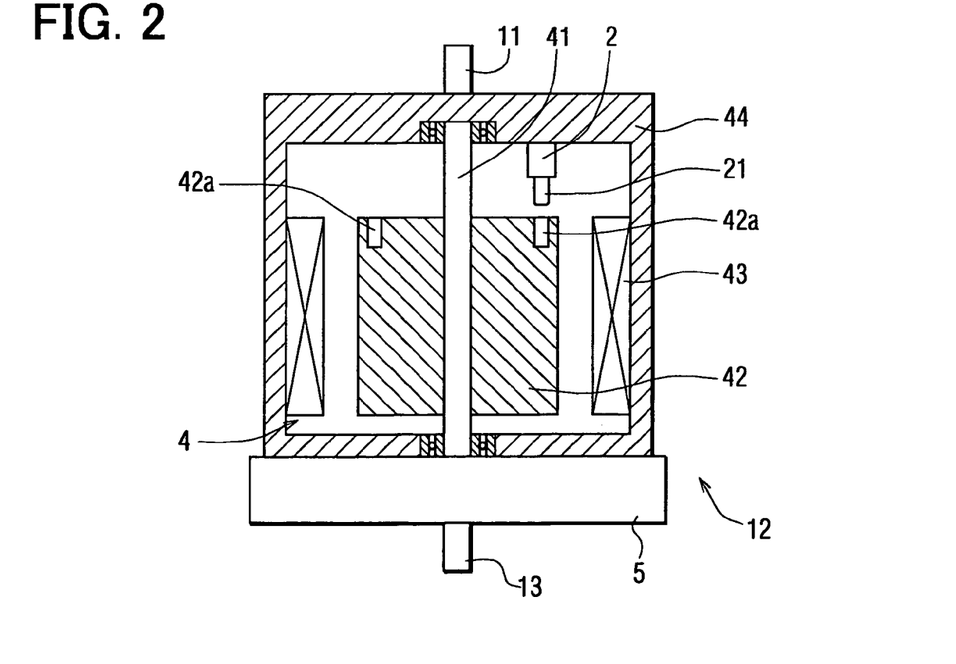
FIG. 2 is a sectional view showing a transfer-ratio varying mechanism unit shown in FIG. 1.

As shown in FIG. 2, the transfer-ratio varying mechanism unit 12 is equipped with an electric motor 4 which is a well-known brushless motor, and a speed reduction mechanism 5, and varies the rotational angle of the output shaft 13 by rotating the electric motor 4 on the basis of the signals from the steering angle sensor 6 and the vehicle-mounted LAN 7. The electric motor 4 is equipped with a stator 43 and a rotor 42 equipped in a motor housing 44.

A joint pin 21, an engaging portion 42a and a solenoid coil 2 for moving the joint pin 21 (a joint mechanism) are equipped on the inner periphery of a motor housing 44 at the steering wheel side. The joint pin 21 is biased so as to be engaged with the engaging portion 42a in parallel to the axial direction of a rotational shaft 41 by a resilient member such as a spring or the like (not shown).

The joint pin 21 is engaged with the engaging portion 42a when no current is supplied to the solenoid coil 2. When current is supplied to the solenoid coil 2 from a solenoid driving circuit 32 in response to an instruction from the transfer-ratio controller 3, electromagnetic force is applied to the joint pin 21 to disengage the joint pin 21 from the engaging portion 42a in parallel to the axial direction of the rotational shaft 41 (in the upward direction in the figure). When this electromagnetic force exceeds the biasing force, the engagement state between the joint pin 21 and the engaging portion 42a is released.

In the above steering mechanism, when the vehicle speed from the vehicle-mounted LAN 7 and the steering angle detected by the steering angle sensor 6 are input to the transfer-ratio controller 3, the transfer-ratio controller 3 calculates a target rotational angle of the output shaft 13 on the basis of these information. A motor control instruction based on the target rotational angle is output as a PWM signal (pulse width modulation signal) from the transfer-ratio controller 3 to the transfer-ratio varying mechanism unit 12.

The electric motor 4 of the transfer-ratio varying mechanism unit 12 is driven in response to the motor control instruction to provide the turning angle corresponding to the rotational angle achieved by adding the target rotational angle of the output shaft 13 with the rotational angle of the steering wheel 10 to the steered wheels 17. Then, the transfer-ratio controller 3 estimates the actual turning angle of the steered wheels 17 by the output angle sensor 14 and carries out feedback operation so that the turning angle corresponding to the target rotational angle can be surely provided to the steered wheels 17.

At this time, current is supplied from the solenoid driving circuit 32 to the solenoid coil 2 to generate electromagnetic force in the solenoid coil 2, and the joint pin 21 is moved so as to be separated from the rotor 42 in parallel to the axial direction of the rotational shaft 41 (in the upward direction in FIG. 2). Thus, the joint between the motor housing 44 and the rotor 42 is released.

When the transfer-ratio controller 3 detects abnormality of the transfer-ratio varying mechanism unit 12, the transfer-ratio controller 3 outputs an instruction to the solenoid driving circuit 32 to stop the current supply to the solenoid coil 2. Accordingly, no electromagnetic force is generated from the solenoid coil 2. Thus the joint pin 21 is moved so as to approach to the rotor 42 (in the downward direction in FIG. 2) in parallel to the axial direction of the rotational shaft 41 by the biasing force of the resilient member (not shown). Then, the joint pin 21 is engaged with the engaging portion 42a equipped in the rotor 42, so that the motor housing 44 and the rotor 42 are joined to each other.

Figure 3:
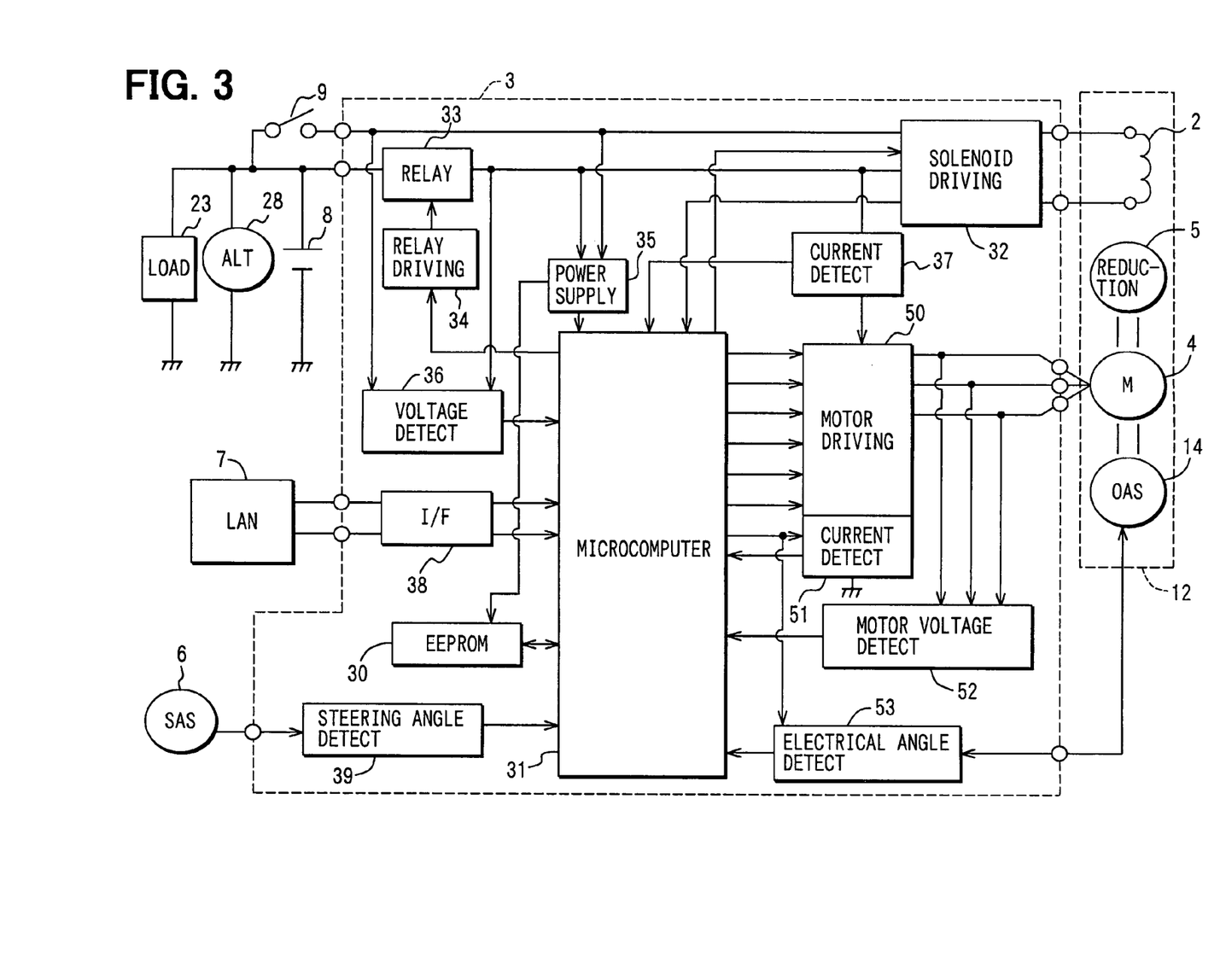
FIG. 3 is a block diagram showing a transfer-ratio controller shown in FIG. 1.

As shown in FIG. 3, the solenoid coil 2 is connected to the transfer-ratio controller 3, and generates electromagnetic force on the basis of a driving signal from the solenoid driving circuit 32, thereby engaging the joint pin 21 and the engaging portion 42a with each other or disengaging them.

The transfer-ratio controller 3 controls the current flowing in the solenoid coil 2 and the driving of the electric motor 4 on the basis of the information from the steering angle sensor 6 and the vehicle-mounted LAN 7. The controller 3 includes a microcomputer 31, a solenoid driving circuit 32, a power source relay 33, a relay driving circuit 34, a power supply circuit 35, a voltage detecting circuit 36, a current detecting circuit 37, a communication I/F (interface) 38, a steering angle detecting circuit 39, a motor driving circuit 50, a current detecting circuit 51, a motor terminal voltage detecting circuit 52 and an electrical angle detecting circuit 53. In this system, a large current of more than tens of amperes flow in the power source relay 33.

The microcomputer 31 calculates the current flowing in the solenoid coil 2 and the electric motor 4 on the basis of the information from the steering angle sensor 6 and the vehicle-mounted LAN 7 and outputs a control signal on the basis of the calculation value. It includes a well-known CPU, ROM, RAM, an input/output interface, a bus line for connecting the above elements, etc. (not shown). Various calculation processing based on the signal to the microcomputer 31 and the control signal output processing from the microcomputer 31 to each peripheral circuit are executed according to control programs stored in the ROM or RAM.

The solenoid driving circuit 32 carries out the engagement between the joint pin 21 and the engaging portion 42a or the disengagement therebetween by controlling the current flowing in the solenoid coil 2 on the basis of the control signal from the microcomputer 31. The solenoid driving circuit 32 is connected to the battery 8 through the power source relay 33.

The power source relay 33 is equipped between the battery 8 and the solenoid driving circuit 32. It is turned on to connect the battery 8 and the solenoid driving circuit 32 to each other, and turned off to disconnect the battery 8 and the solenoid driving circuit 32 from each other. The power source relay 33 is turned on or off by the relay driving circuit 34 operated on the basis of the control signal from the microcomputer 31.

The power supply circuit 35 is connected to the battery 8 through an IG (ignition) switch 9, and supplies current from the battery 8 to the microcomputer 31. The voltage detecting circuit 36 detects the voltage value of the battery 8 and inputs the detection value to the microcomputer 31. The current detecting circuit 37 supplies current to the motor driving circuit 50 from the battery 8, detects the current value and inputs the current value thus detected to the microcomputer 31.

The communication I/F 38 converts the vehicle speed signal, the engine speed signal, etc. from the vehicle-mounted LAN 7 so that these signals can be processed by the microcomputer 31. It inputs the vehicle speed signal and the engine speed signal thus converted to the microcomputer 31. Furthermore, a signal for forcedly changing the above target rotational angle from the vehicle-mounted LAN 7 is input to the communication I/F 38 to suppress unstable behavior of the vehicle. This signal is input to the microcomputer 31. The signal for changing the target rotational angle is input to the communication I/F 38 when the steered wheels 17 are in slipping condition or the like.

The steering angle detecting circuit 39 converts the signal from the steering angle sensor 6 so that the signal concerned can be recognized by the microcomputer 31. It input the signal thus converted to the microcomputer 31.

The motor driving circuit 50 has six switching transistors constituting a well-known three-phase bridge circuit. It performs a PWM duty control on the six switching transistors on the basis of a driving signal from the microcomputer 31, thereby driving the electric motor 4.

The current detecting circuit 51 detects current flowing in the six switching transistors of the motor driving circuit 50, and inputs these current values thus detected into the microcomputer 31. The motor terminal voltage detecting circuit 52 detects voltages of the six switching transistors of the current detecting circuit 50, and inputs these voltage values to the microcomputer 31.

The electrical angle detecting circuit 53 converts the rotational angle (electrical angle) detected by the output angle sensor 14 connected to the speed reduction mechanism 5 through the output shaft 13 so that the rotational angle can be processed by the microcomputer 31, and inputs the rotational angle signal thus converted to the microcomputer 31.

As the operation of the transfer-ratio varying steering device 1, the microcomputer 31 outputs the control signal to the solenoid driving circuit 32 so that current flows through the solenoid 2 by the solenoid driving circuit 32, whereby the joint pin 21 and the engaging portion 42a is set to an engagement-released state. Accordingly, the joint between the motor housing 44 and the rotor 42 is released. By rotating the electric motor 4 on the basis of the signals from the steering angle sensor 6 and the vehicle-mounted LAN 7, the rotational force of the electric motor 4 is transmitted through the speed reduction mechanism 5 to the output shaft 13.

The torque achieved by adding the steering force applied by a driving with the torque of the output shaft 13 to which the rotational force of the electric motor 4 is transmitted is detected by a torque sensor of an electric power steering device (not shown), and the turning angle of the steered wheels 17 is varied by the electric motor 4 of the electric power steering device (not shown).

Figure 4:
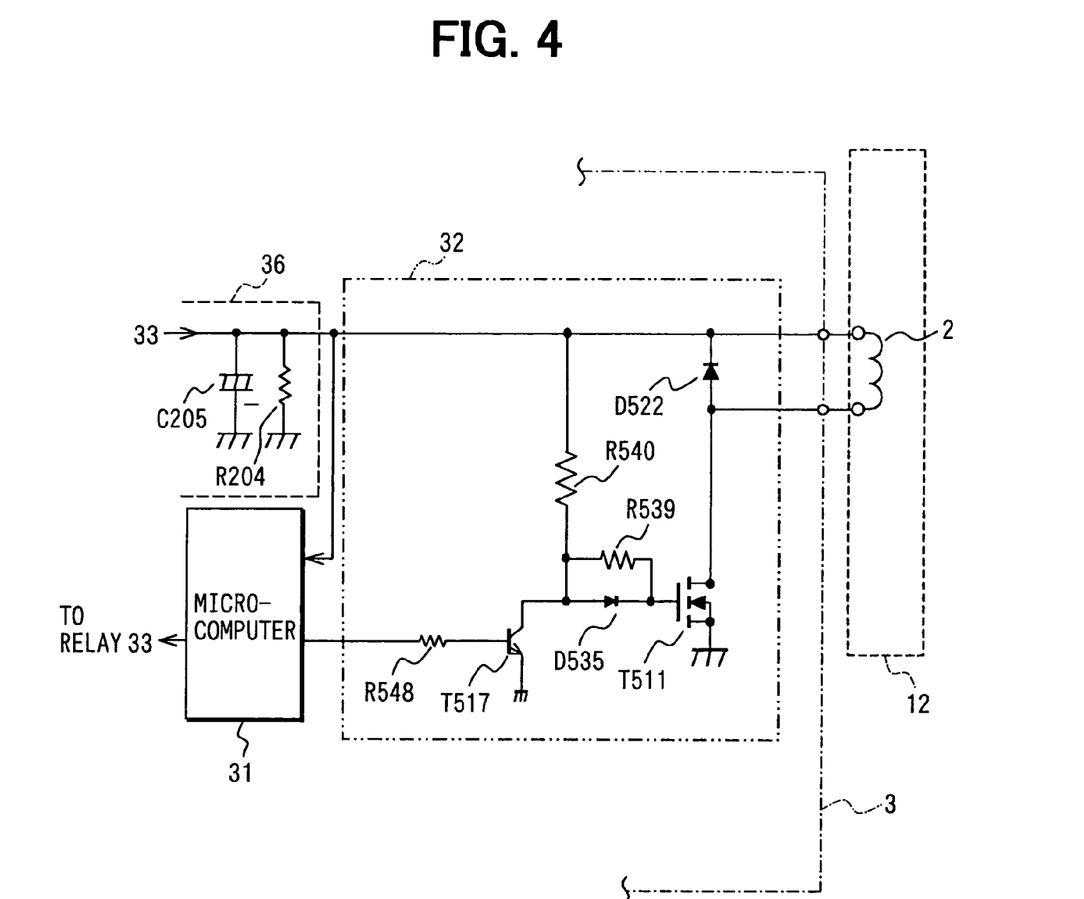
FIG. 4 is a circuit diagram showing a fusion detecting circuit part according to the first embodiment.

The fusion detecting circuit part in the first embodiment is shown in FIG. 4. In FIG. 4, the voltage detecting circuit 36 includes a resistor R204 (first resistor) and a capacitor C205, which are connected to the power source relay 3 as a fusion detecting circuit, in the similar manner as in FIG. 8. In this embodiment, however, resistors R540 (second resistor), R548 and a transistor T517 (switching element) are additionally provided.

The control instruction from the microcomputer 31 to the solenoid 2 is transmitted as the PWM signal, and a transistor T517 for amplification is subjected to duty operation. A voltage occurs between both ends of a resistor R540 when the transistor T517 is subjected to duty operation. The transistor T511 is also subjected to duty operation by the gate voltage thus developing, so that current flows in the solenoid 2. The resistor R540 is connected to the same power supply line, at the output side of the power source relay 33, as the resistor R204 shown in FIG. 8.

When the power supply relay 33 is varied from the ON-state to the OFF-state, the charge accumulated in the capacitor C205 are discharged by the resistor R204 and the resistor R540. That is, the resistor R540 operates as a resistance element of the solenoid driving circuit 32 when the power source relay 33 is set to the ON-state, and also operates as a resistance element for discharging charges in the capacitor C205 when the power source relay 33 is changed from the ON-state to the OFF-state.

That is, the microcomputer 31 outputs an instruction to the relay driving circuit 34 to set the power supply relay 33 from the ON-state to the OFF-state. It also outputs to the transistor T517 a signal indicating that the duty ratio for driving the transistor T517 to 100% is set to 100%. Accordingly, the transistor T517 is set to the ON-state at all times, and two discharge paths of a path extending from the resistor R204 to the ground and a path extending from the resistor R540 through the transistor T517 to the ground, whereby the charge accumulated in the capacitor C205 are discharged by the resistor R204 and the resistor R540. Accordingly, in this embodiment, the resistor R204, the resistor R540 and the transistor T517 for amplification forms a charge removing circuit.

Figure 5:
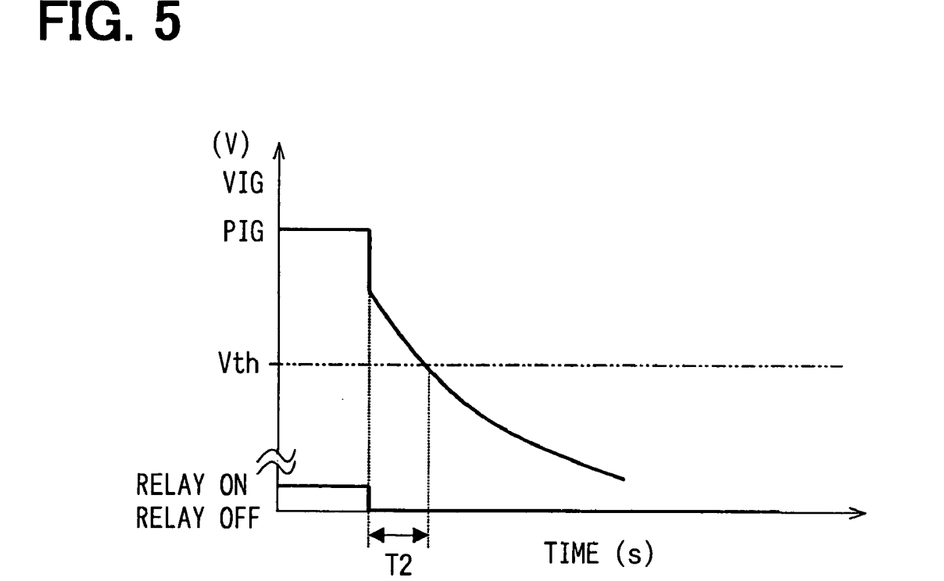
FIG. 5 is a signal diagram showing variation of an output voltage of a power source relay in the first embodiment.

As a result, the voltage of the capacitor C205, that is, the output voltage of the power source relay 33, decreases more quickly as shown in FIG. 5 than in the case of FIGS. 8 and 9. The voltage decreases to the threshold value Vth in a period T2 shorter than the period T1. Therefore, the microcomputer 31 can detect the fusion of the power source relay 33 in a short time based on the output voltage of the power source relay 33.

The voltage applied between both ends of the resistor R540 is proportional to the duty ratio for driving the transistor T517. For example, when the transistor T517 is driven at a duty ratio of 50%, a half value of the voltage of the battery 8, that is, the voltage applied between both ends of the resistor R204, is applied between both ends of the resistor R540.

Furthermore, power to be consumed by a resistor is generally proportional to the square of a voltage applied between both ends of the resistor. Therefore, when the transistor T517 is driven at a duty ratio of 50%, the power to be consumed by the resistor R540 is equal to a quarter of the power consumed under mere ON-state (duty ratio of 100%), and heating of the resistor R540 is also suppressed. According to this embodiment, it is unnecessary to use parts having high thermal resistance, and thus the manufacturing cost of the transfer-ratio controller 3 can be reduced.

The same effect can be achieved by increasing the value R1 of the resistor R204 to R2 and setting the value R3 of the resistor R540 to (R1×R2)/(R2−R1) in FIGS. 3 and 5. It is well known that when resistance elements are connected to one another in parallel, a larger amount of current flows in a resistance element having a lower resistance value. That is, the heating of the resistor R204 is suppressed by making a larger amount of current flow in the resistor R540.

Second Embodiment

Figure 6:
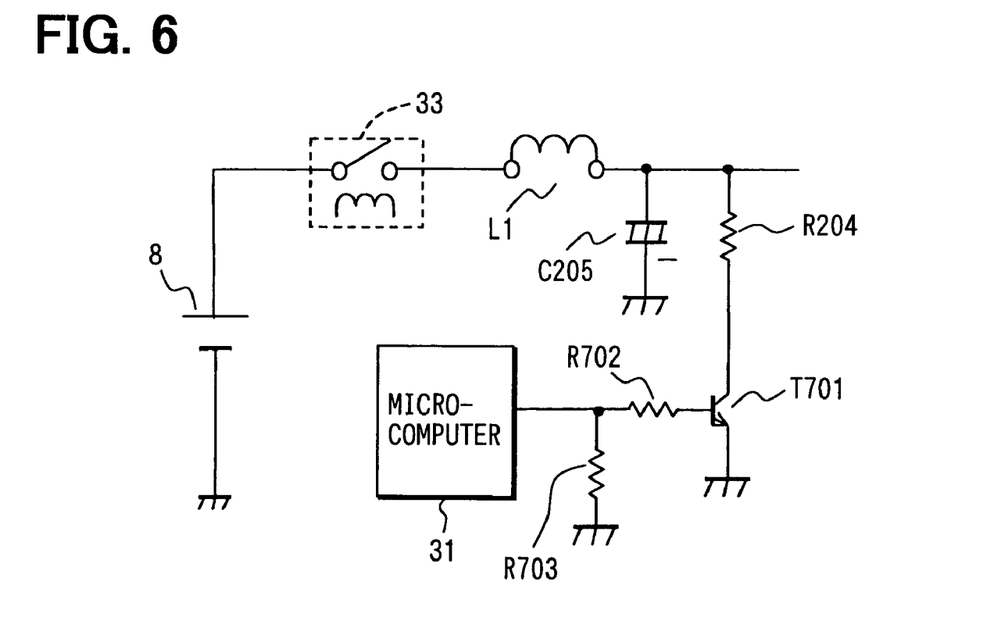
FIG. 6 is a circuit diagram showing a fusion detecting circuit part according to the second embodiment.

A second embodiment is shown in FIG. 6. A transistor T701 is connected between a resistor R204 of the motor driving circuit 50 (FIG. 3) and the ground, and the output terminal of the microcomputer 31 and the base terminal of the transistor T701 are connected to each other through a resistor R702.

When the power relay 33 is set to the ON-state, a control instruction is transmitted as a PWM signal from the microcomputer 31 to the transistor T701, and the transistor T701 is subjected to duty operation. The microcomputer 31 outputs to the relay driving circuit 34 an instruction for setting the power source relay 33 from the ON-state to the OFF-state, and also outputs to the transistor T701 a signal for setting the duty ratio for driving the transistor T701 to 100%, whereby the transistor T701 is set to the ON-state at all times and a discharge path extending from the resistor R204 through the transistor T701 to the ground is formed, so that the charge accumulated in the capacitor C205 are discharged by the resistor R204. Therefore, according to this embodiment, the charge removing means is constructed by the resistor R204 and the transistor T701.

The voltage applied between both ends of the resistor R204 is proportional to the duty ratio for driving the transistor T701. For example, when the transistor T701 is driven at a duty ratio of 50%, a half value of the voltage of the battery 8 (the voltage applied between both ends of the conventional resistor R204) is applied between both ends of the resistor R204.

Furthermore, power to be consumed by a resistor is generally proportional to the square of a voltage applied between both ends of the resistor. Therefore, when the transistor T701 is driven at a duty ratio of 50%, the power consumed by the resistor R204 is equal to a quarter of the prior art, and heating of the resistor R204 is also suppressed. Furthermore, when the power source relay 33 is set to the ON-state, the heating of the resistor R204 is nullified by setting the driving duty ratio from the microcomputer 31 to the transistor T701 to 0% (the OFF-state). According to this embodiment, it is unnecessary to use parts having high thermal resistance, and thus the cost for manufacturing the transfer-ratio controller 3 can be reduced.

Third Embodiment

Figure 7:
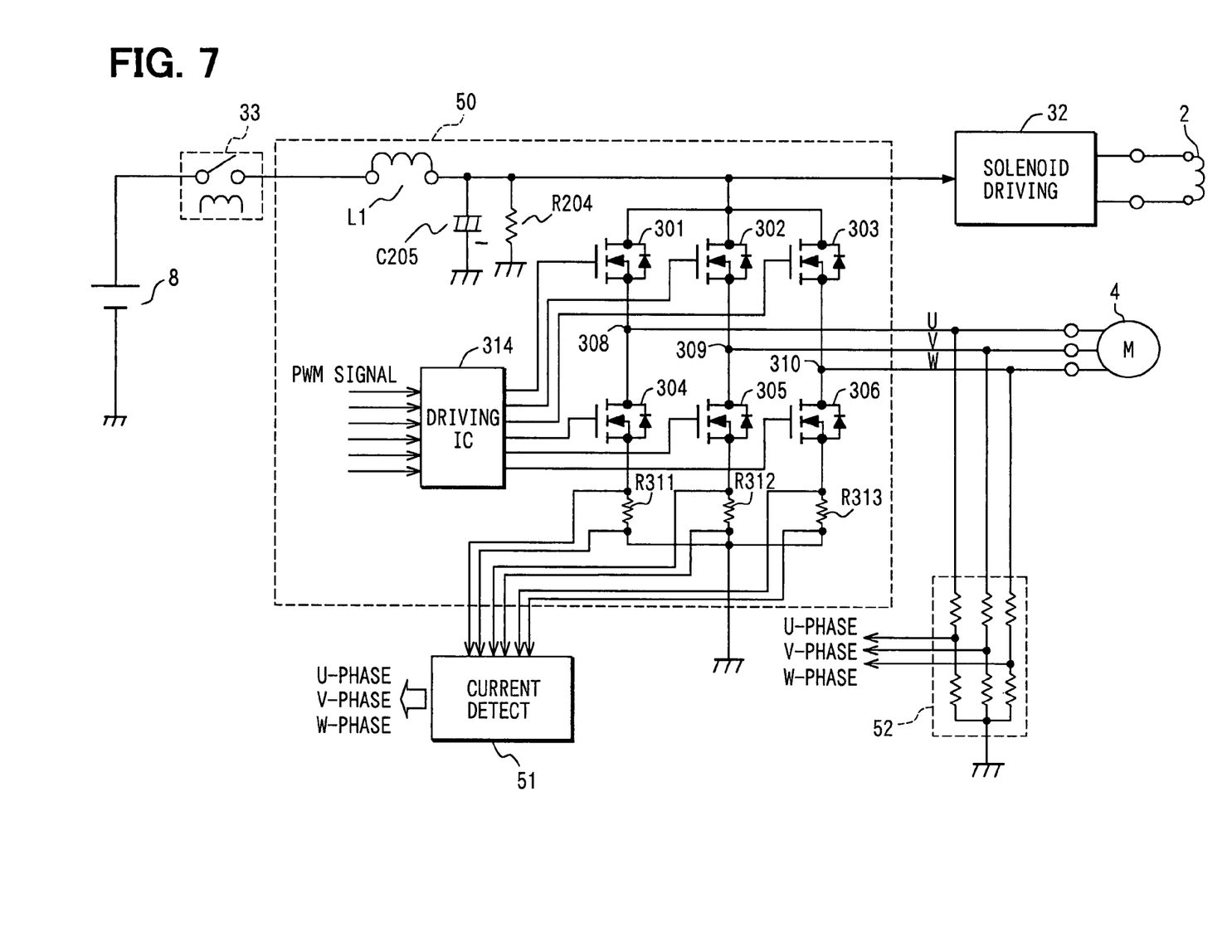
FIG. 7 is a circuit diagram showing a fusion detecting circuit part according to the third embodiment.

A third embodiment is shown in FIG. 7. The motor driving circuit 50 is wired to form a well-known three-phase bridge circuit. The circuit 50 includes fly-wheel diodes forming a bypass path of induced current caused by the switching of three-phase coils of U, V, W of the motor 4. If switching elements 301 to 306 are subjected to switching operation by using the rotational angle signal from the output angle sensor 14 and the PWM signal from a driving IC 314 which is based on an instruction from the microcomputer 31, a coil whose phase is associated with current supply can be selectively subjected to PWM current supply.

The switching elements 301, 302, 303 carry out switching operations of U-phase, V-phase and W-phase, respectively. Those switching elements are used as upper arm side switching elements. Furthermore, the switching elements 304, 305, 306 carry out the switching operations of U-phase, V-phase and W-phase, respectively. Those switching elements are used as lower arm side switching elements.

Resistors R311, R312, R313 are shunt resistors for determining the values of current flowing in U-phase, V-phase and W-phase, respectively. The voltage between both ends of each of these resistors is measured, converted to a value which can be processed by the microcomputer 31 in the current detecting circuit 51 and then transmitted to the microcomputer 31.

When the microcomputer 31 outputs an instruction to the relay driving circuit 34 so as to set the power source relay 33 from the ON-state to the OFF-state and the switching element 301 and the switching element 304 are PWM-driven at a duty ratio of 100%, a discharge path extending from the switching element 301 through the switching element 304 and the resistor R311 to the ground is formed. The charge accumulated in the capacitor C205 is discharged through the resistor R204 and the resistor R311. Accordingly, in this embodiment, the resistor R204, the switching element 301, the switching element 304 and the resistor R311 form the charge removing circuit.

Likewise, when the switching element 302 and the switching element 305, or the switching element 303 and the switching element 306 are PWM-driven at a duty ratio of 100%, the charge accumulated in the capacitor C205 are discharged by the resistor R204 and the resistor R312 or by the resistor R204 and the resistor R313. Accordingly, in this embodiment, the charge removing circuit is also formed by the resistor R204, the switching element 302, the switching element 305 and the resistor R312 or the resistor R204, the switching element 303, the switching element 306 and the resistor R313.

The same effect can be achieved by increasing the value of the resistor R204 with respect to the overall resistance value of the discharge path extending from the switching element 301 through the switching element 304 and the resistor R311 to the ground. It is well known that when the resistance elements are connected to one another in parallel, a larger amount of current flows in a resistance element having a lower resistance value. That is, a larger amount of current flows into the discharge path extending from the switching element 301 through the switching element 304 and the resistor R311 to the ground, whereby the heating of the resistor R204 is suppressed. The same is satisfied to the path formed by the other two switching elements and the resistor.

Fourth Embodiment

When the microcomputer 31 outputs an instruction to the relay driving circuit 34 to set the power source relay 33 from the ON-state to the OFF-state and also PWM-drives the switching element 301 and the switching element 305 at a duty ratio of 100%, a discharge path extending from the switching element 301 through the motor 4, the switching element 305 and the resistor R312 to the ground is formed. Thus, the charge accumulated in the capacitor C205 is discharged by the resistor R204, resistance components contained in the coil of the motor 4 and the resistor R312.

Likewise, when the switching element 301 and the switching element 306 are PWM-driven at a duty ratio of 100%, a discharge path extending from the switching element 301 through the motor 4, the switching element 306 and the resistor R313 to the ground is formed. The charge accumulated in the capacitor C205 is discharged by the resistance component contained in the coil of the motor 4 and the resistor R313 (the charge removing circuit). Accordingly, in this embodiment, the charge removing circuit is constructed by the resistor R204, the resistance component contained in the coil of the motor 4 and resistor R312, or the resistor R204, the resistance component contained in the coil of the motor 4 and the resistor R313.

Likewise, when the switching element 302 and the switching element 304 or the switching element 302 and the switching element 306 are PWM-driven at a duty ratio of 100%, the charge accumulated in the capacitor C205 is discharged by the resistor R204, the resistance component contained in the coil of the motor 4 and the resistor R311 (the charge removing circuit) or the resistor R204, the resistance component contained in the coil of the motor 4 and the resistor R313 (the charge removing circuit).

Likewise, when the switching element 303 and the switching element 304 or the switching element 303 and the switching element 305 are PWM-driven at a duty ratio of 100%, the charge accumulated in the capacitor C205 is discharged by the resistor R204, the resistance component contained in the coil of the motor 4 and the resistor R311 (the charge removing circuit) or the resistor R204, the resistance component contained in the coil of the motor 4 and the resistor R312 (the charge removing circuit).

In this embodiment, the motor 4 is rotated because current flows into the motor 4. However, when the power source relay 33 is set to the OFF-state, the solenoid 2 is not driven. The joint pin 21 is engaged with the engaging portion 42a equipped to the rotor 42, so that the motor housing 44 and the rotor 42 are kept joined to each other. Therefore, even when the motor 4 is rotated, the output shaft 13 is not rotated and thus the wheels 17 are not moved. As a result, the motion of the vehicle becomes unstable.

The same effect can be achieved by increasing the value of the resistor R204 with respect to the overall resistance value of the discharge path extending from the switching element 301 through the motor 4, the switching element 305 and the resistor R312 to the ground. It is well known that when the resistance elements are connected to one another in parallel, a larger amount of current flow in a resistance element having a lower resistance value. That is, the heating of the resistor R204 can be suppressed by making a larger amount of current flow into the discharge path extending from the switching element 301 through the motor 4, the switching element 305 and the resistor R312 to the ground. The same is satisfied to a discharge path formed by the upper arm side switching elements 301 to 303, the motor 4, the lower arm side switching elements 304 to 306 and the resistors R311 to R313.

If the total resistance value of the discharge path in all the above embodiments is smaller than the conventional resistance value of the resistor R204, the discharge time can be shortened as shown in FIG. 5 because the output voltage VIG of the relay 33 is represented by PIG X exp(-t/RC). That is, a detecting circuit for detecting the fusion of the power source relay 33 may be constructed by the discharge path and the capacitor C205 in all the embodiments.

The present invention is not limited to these embodiments. Various modifications may be made to each of the above embodiments without departing from the spirit of the invention.

What is claimed is:

1. An electronic control system comprising:
a power source;
an actuator;
a controller for controlling the actuator;
a power source relay for supplying and cutting off a supply of power to at least one of the actuator and the controller when set to an ON-state and an OFF-state, respectively;
a fusion detecting means including a first resistor and a capacitor connected between the power source relay and a ground to detect fusion of the power source relay based on a voltage of the capacitor;
a second resistor connected in parallel to the first resistor between the power source relay and the ground;
a switching element connected to one of the first resistor and the second resistor in series;
a charge removing means for setting the switching element to an ON-state when the power source relay is set to the OFF-state, thereby discharging a charge accumulated in the capacitor through the first resistor and the second resistor, so that the fusion detecting means detects the fusion of the power source relay based on the voltage of the capacitor;
an input shaft connected to a steering wheel;
an output shaft connected to the steered wheel;
a transfer-ratio varying mechanism unit for varying a rotational angle of the output shaft with respect to a rotational angle of the input shaft; and
a joint mechanism for making the input shaft and the output shaft rotatable integrally with each other,
wherein the second resistor and the switching element are provided as a part of a circuit that normally controls a solenoid for joining the input shaft and the output shaft or releasing the joint thereof in the joint mechanism.

2. The electronic control system according to claim 1, wherein the switching element is set to the ON-state only when the power source relay is set to the OFF-state.

3. An electronic control system comprising:
a power source;
an actuator;
a controller for controlling the actuator;
a power source relay for supplying and cutting off a supply of power to at least one of the actuator and the controller when set to an ON-state and an OFF-state, respectively;
a fusion detecting means including a first resistor and a capacitor connected between the power source relay and a ground to detect fusion of the power source relay based on a voltage of the capacitor;
a second resistor connected in parallel to the first resistor between the power source relay and the ground;
a switching element connected to one of the first resistor and the second resistor in series;
a charge removing means for setting the switching element to an ON-state when the power source relay is set to the OFF-state, thereby discharging a charge accumulated in the capacitor through the first resistor and the second resistor, so that the fusion detecting means detects the fusion of the power source relay based on the voltage of the capacitor;
an input shaft connected to a steering wheel;
an output shaft connected to the steered wheel; and
a transfer-ratio varying mechanism unit for varying a rotational angle of the output shaft with respect to a rotational angle of the input shaft,
wherein the second resistor and the switching element are provided as a part of a motor driving circuit for driving a motor to thereby rotate the output shaft, wherein the second resistor is further provided as a resistor for detecting current flowing in the motor.

4. The electronic control system according to claim 3, wherein the switching element is connected to the second resistor and provided to control the motor.

5. The electronic control system according to claim 1, wherein the second resistor has a value with which the fusion of the power source relay can be detected in the power relay fusion detecting means.

6. The electronic control system according to claim 1, further comprising:
PWM control means for carrying out duty control on the switching element.

7. An electronic control system comprising;
a power source;
an actuator;
a controller for controlling the actuator;
a power source relay for supplying and cutting off a supply of power to the controller when set to an ON-state and an OFF-state, respectively;
a fusion detecting means including a resistor and a capacitor connected between the power source relay and a ground to detect fusion of the power source relay;
a switching element connected in series to the resistor;
a charge removing means for setting the switching element to an ON-state when the power source relay is set to the OFF-state, thereby discharging a charge accumulated in the capacitor through the resistor;
an input shaft connected to a steering wheel;
an output shaft connected to the steered wheel; and
a transfer-ratio varying mechanism unit for varying a rotational angle of the output shaft with respect to a rotational angle of the input shaft by the actuator, wherein the switching element is provided in the controller to normally control the actuator.

8. The electronic control system according to claim 1, wherein the switching element is set to the ON-state only when the power source relay is set to the OFF-state.

9. The electronic control system according to claim 7, wherein the switching element is normally duty-controlled when the power source relay is set to the ON-state, and continuously turned on when the power source relay is set to the OFF-state.

* * * * *